(12) United States Patent
Kobayashi

(10) Patent No.: US 6,503,667 B1
(45) Date of Patent: Jan. 7, 2003

(54) METHOD FOR FABRICATING MASK

(75) Inventor: Shinji Kobayashi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 60 days.

(21) Appl. No.: 09/697,424

(22) Filed: Oct. 27, 2000

(30) Foreign Application Priority Data

May 2, 2000 (JP) ........................................ 2000-133750

(51) Int. Cl.⁷ .............................. G03F 9/00; G03C 5/00
(52) U.S. Cl. ........................................... 430/5; 430/394
(58) Field of Search ........................... 430/5, 322, 323, 430/324, 394; 216/58, 83

(56) References Cited

U.S. PATENT DOCUMENTS

| | | | | |
|---|---|---|---|---|
| 5,424,154 A | * | 6/1995 | Borodovsky | 430/5 |
| 6,194,103 B1 | * | 2/2001 | Tzu et al. | 430/5 |
| 6,387,596 B2 | * | 5/2002 | Cole et al. | 430/5 |

FOREIGN PATENT DOCUMENTS

| | | |
|---|---|---|
| JP | 8-234410 | 9/1996 |
| JP | 9-311432 | 12/1997 |

OTHER PUBLICATIONS

"Advanced Cr Dry Etching Process", AOYAMA et al., SPIE Symposium on Photomask and X–Ray Mask Technology VI, Yokohama, Japan, Sep. 1999 SPIE vol. 3748, pp. 137–146.

* cited by examiner

Primary Examiner—S. Rosasco
(74) Attorney, Agent, or Firm—Nixon & Vanderhye P.C.

(57) ABSTRACT

A method for fabricating a mask comprising the steps of: (a) forming a light-shielding film on an entire surface of a substrate including an actual pattern region and an unoccupied region other than the actual pattern region; (b) patterning the light-shielding film on the actual pattern region while leaving the light-shielding film on the unoccupied region; and (c) removing the light-shielding film on the unoccupied region while leaving the patterned light-shielding film on the actual pattern region.

12 Claims, 6 Drawing Sheets

METHOD FOR FABRICATING MASK

CROSS-REFERENCE TO RELATED APPLICATION

This application is related to Japanese application No. 2000-133750 filed on May 5, 2000, whose priority is claimed under 35 USC §119, the disclosure of which is incorporated by reference in its entirety.

BACKGROUND OF THE INVENTION

1. Field of the Invention

The present invention relates to a method for fabricating a mask.

2. Description of Related Art

In a conventional photolithography process for fabricating semiconductor devices, a mask obtained by forming a chrome film as a light-shielding film in a certain configuration on a quartz substrate has been generally utilized.

The patterning of the chrome film is generally performed by a lithography step of applying a resist to the quartz substrate on which the chrome film has been formed and patterning the resist using an electron beam (hereinafter referred to as EB), and an etching step of patterning the chrome film using the patterned resist as a mask.

In the etching step of the chrome film, wet etching has been customarily used and still goes mainstream in the mask fabrication. This is an opposite tendency to a wafer process in factory manufacture that has been studying and utilizing dry etching from an early stage. There are two reasons for this.

First, the miniaturization of the mask has not been required very much. In the wafer process, a reduction projection aligner (hereinafter referred to as a stepper) has realized miniaturization in the photolithography. Accordingly, the pattern of the mask has been satisfactory in the order of 5 times or 10 times larger than a pattern to be formed on the wafer. Therefore the mask miniaturization has been less required.

Second, wet etching is isotropic in general so that etching shift surely occurs. Further, if a film to be etched includes step difference or variation in film thickness, the resulting pattern configuration of the film will not be uniform. Therefore, in the wafer process, dry etching has been employed to inhibit the etching shift and the variation in the pattern configuration. On the other hand, since there is no step difference and variation in thickness on the mask substrate, it has not been necessary to deal with them in the mask fabrication.

In the advanced technology, dry etching is getting required and applied to fabricate the mask.

The first reason is that the mask pattern size of 4 times larger than a pattern to be formed on the wafer is required because a scanner system is getting commonly used in the photolithography process instead of the conventionally utilized stepper system. All commercially available scanner systems form the resist pattern on a wafer by one-fourth reduction exposure. In short, reduction ratio of a mask is 4 times and it is smaller than a stepper system.

The second reason is that as the wafer is further miniaturized, a relationship between exposure light wavelength and patterning size is reversed and needs for a proximity exposure effect correction mask is increased. In the case where an object (e.g., a conductive film, an insulating film, a resist film) is patterned on the wafer in the order smaller than the exposure light wavelength by photolithography, it is necessary to precisely adjust the amount of light transmitting from an aperture of resist (light intensity) and influence of the light diffraction. This adjustment requires extremely high resolution as compared with the prior art because a microscopic pattern that cannot be resolved on the wafer must be formed precisely on the mask. Accordingly, the miniaturization of the mask is an exigent objective.

Thus, forming the mask pattern by dry etching can improve the pattern configuration (edge roughness and sectional configuration) and the resolution of the microscopic pattern.

At present, dry etching for fabricating the mask pattern generally utilizes a mixture gas of chlorine or dichloromethane and oxygen. In this case, how to alleviate difference in etching rate depending on area to be etched is important to form a uniform and highly precise chrome mask pattern.

For example, in the case shown in FIG. 5, a resist pattern is formed on a chrome film which has been formed on a quartz substrate 40 and the chrome film is patterned into a chrome pattern 41 using the resist pattern as a mask. At this stage, the resist surrounding regions A, B and C are different in area, which varies the etching rate of the chrome film in each region. As a result, the resulting chrome patterns vary in size. In FIG. 5, there is established a relationship among the width of space between the chrome pattern lines in the region A>the width of space between the chrome pattern lines in the region B>the width of space between the chrome pattern lines in the region C. That is, a difference between the space width of the chrome pattern lines in the region A and the space width of the chrome pattern lines in the region C is 0.02 $\mu$m. This is considered because molecules of the resist are decomposed through the etching and generate hydrogen ions, which inhibit the etching of the chrome film. Therefore, the more the resist exists around the chrome film to be etched, the greater the hydrogen ions occur, and as a result, the etching rate of the chrome film decreases.

Further, in the case shown in FIG. 6 in which a chrome film 51 is etched using a positive resist pattern 50 which is commonly used in the stepper or scanning projection aligner as a mask, the chrome film will have variation in width of the patterned lines in regions D, E and F due to the existence of the resist film 52 formed on the periphery of a unit cell (chip). In FIG. 6, there is established a relationship among the width of the patterned chrome line in the region D>the width of the line in the region E>the width of the patterned chrome line in the region F.

Since the difference in etching rate of the chrome film depending on the configuration of the resist pattern (resist area) impedes the formation of the precise chrome pattern, such difference must be reduced or inhibited in order to form a highly precise proximity exposure effect correction mask.

Japanese Unexamined Patent Publication No. Hei 8 (1996)-234410 proposes a method for inhibiting the difference in etching rate of the chrome film depending on the surrounding resist by providing on the chip periphery a dummy pattern for correcting the uniformity of the dry etching rate. According to this method, the size variation among the patterned chrome lines on regions E and F positioned near the chip periphery and the patterned chrome line on the region D in the chip center can be reduced. However, the variation depending on the layout of the pattern lines as shown in FIG. 5 cannot be reduced.

Further, Japanese Unexamined Patent Publication No. Hei 9 (1997)-311432 proposes a method for forming a dummy pattern having almost the same width as that of the actual pattern in a semiconductor chip. According to the method, the difference in density of the pattern lines in the semiconductor chip is alleviated and thus the size variation of the resulting patterns can be reduced. However, this method is intended for fabricating the semiconductor chips. For fabricating the mask, as shown in FIG. 6, the large resist film 52 remains in the chip periphery so that the size variation among the chrome pattern lines in the regions E and F near the periphery and the region D in the chip center cannot be reduced.

Still further, a method of dry etching the chrome film using a mixture gas prepared by adding $H_2$ or HCl to $Cl_2$ gas has been proposed (Photomask Japan '99 Proceeding 137p). According to the method, the concentration of the hydrogen ions inhibiting the chrome etching is controlled to be uniform on the mask surface by supplying the hydrogen ions to the etching gas. Accordingly the etching rate can be uniform on the entire surface, though the etching rate of the chrome film is lowered in total. Thus, the size variation in chrome pattern lines can be reduced.

However, as shown in FIG. 7, the chrome pattern lines still vary in width even though the optimized etching gas is used. The reason is considered that the positive resist pattern used to pattern the chrome film has not been uniformly formed. That is, in the lithography step using EB, a phenomenon called fogging occurs, in which electrons that once entered the resist film are reflected out, and reflected again on the EB optical system and then re-enter the resist film. Therefore, EB dosage is not uniformly formed depending on the configuration of the resist pattern to be obtained, and as a result, the variation of the resist pattern occurs. For example, in the case of forming a resist pattern corresponding to the chrome pattern shown in FIG. 5, the amount of electrons that re-enters the resist film due to the fogging increases in the region A surrounded by the large exposure area. Accordingly, the space width between the patterned resist lines increases as compared with that in the region B.

The fogging theoretically tends to be amplified depending on the acceleration voltage and the light exposure amount of the EB exposure system. However, it is impossible so far to completely inhibit the phenomenon by the currently available systems.

Further, the size variation among the resist pattern lines caused by the fogging proceeds in the same direction as the variation of the chrome patterns caused by the etching. Therefore the reduction of the variation is quite difficult.

SUMMARY OF THE INVENTION

The present invention has been achieved in view of the above. The object of the present invention is to provide a method for fabricating a mask capable of inhibiting the difference in the etching rate of the chrome film due to the fogging and the area of the surrounding resist, regardless of the pattern layout in LSI.

Accordingly, the present invention provides a method for fabricating a mask comprising the steps of: fabricating a light-shielding film on an entire surface of a substrate including an actual pattern region and an unoccupied region other than the actual pattern region; patterning the light-shielding film on the actual pattern region while leaving the light-shielding film on the unoccupied region; and removing the light-shielding film on the unoccupied region while leaving the patterned light-shielding film on the actual pattern region.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1A:
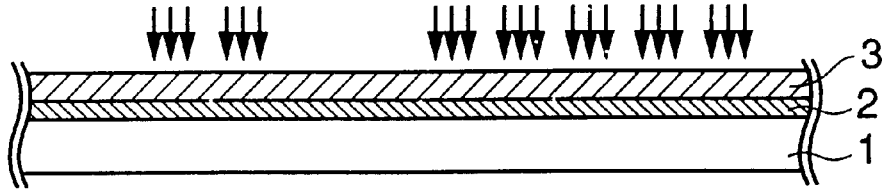
FIGS. 1(*a*) to 1(*f*) are sectional views of a major part for illustrating formation steps according to an embodiment of a method for fabricating a mask of the present invention.

In the method for fabricating the mask according to the present invention, first, a light-shielding film is formed on the entire surface of a semiconductor substrate having an actual pattern region and an unoccupied region other than the actual pattern region in the step (a).

The substrate utilizable in the present invention is not particularly limited as long as the substrate can transmit exposure light when it is subjected to photolithography as a mask substrate. For example, a quartz substrate can be used. The thickness of the substrate may vary depending on the material used, but may be about 0.25 inches or more, for example.

The substrate includes at least an actual pattern region on which an actual pattern will be formed in a later step and an unoccupied region other than the actual pattern region. The actual pattern in this context signifies a pattern finally provided on a finished mask. The unoccupied region signifies in general a region in a unit cell on which the actual pattern is not formed. The substrate may include, in addition to the above regions, a periphery region positioned around a field region of the substrate and regions between the cells to serve as dicing lines.

The light-shielding film formed on the entire surface of the substrate is not particularly limited as long as it can completely or almost completely shut out the exposure light with a certain thickness. Examples thereof include a metal film, an alloy film, a half tone film (e.g., $MoSiO_xN_y$ ($0 \leq x \leq 1$, $0 \leq y \leq 1$)) or a layered film thereof. Among them, a chrome film is preferable. The light-shielding film can be formed by a known method, e.g., sputtering, chemical vapor deposition and the like. The thickness of the light-shielding film is not particularly limited as long as it can completely or almost completely shut out the exposure light, but may be about 50 to about 120 nm, for example.

In the step (b), the light-shielding film on the actual pattern region is patterned into a desired configuration while leaving the light-shielding film on the unoccupied region.

The desired configuration in this context is preferably a final actual pattern configuration so that the patterned light-shielding film can serve as the actual pattern. However, the light-shielding film may be patterned into not the final actual pattern configuration, but a pattern similar to it, depending on the configuration of the actual pattern to be obtained, the position and size of the actual pattern region and the position and size of the unoccupied region and the like. The configuration of the actual pattern is not particularly limited and L/S, length and density of the pattern may suitably be selected according to the characteristics of a semiconductor device to be finally obtained.

In the unoccupied region, the light-shielding film preferably remains on the whole surface of the unoccupied region while providing a certain space between the edge of the remaining light-shielding film and the actual pattern region. However, the light-shielding film may remain not entirely, but partially on the unoccupied region by patterning into a desired configuration, depending on the configuration of the actual pattern, the position and size of the actual pattern region and the position and size of the unoccupied region. The size and the configuration of the unoccupied region itself are not particularly limited. The space between the edge of the light-shielding film remaining on the unoccupied region and the actual pattern region can be determined taking EB alignment margin into consideration. For example, the space may be about 1 to about 5 $\mu$m, or about 1 to about 3 $\mu$m. In particular when the EB alignment margin is about ±0.5 $\mu$m, the space may be double of the margin, i.e., about 2 $\mu$m.

In this step, it is preferable to leave the light-shielding film also on the periphery region around the field region of the substrate and the regions between the cells.

The patterning of the light-shielding film can be performed by a known method, for example, photolithography and etching. First, in a photolithography step, a positive or negative resist which is known in the art is applied on the light-shielding film and exposed to light for development using a known exposure system such as EB exposure system, laser exposure system or the like. Thus, a resist mask is formed and the light-shielding film is etched using the resist mask. The light exposure may be performed by full-wafer exposure or drawing exposure.

For fabricating the resist mask, for example, original data of the actual pattern is prepared and plus resizing is performed to the original data. Then the resized data is reversed to obtain dummy pattern data. OR calculation is then performed to the original data of the actual pattern and the dummy pattern data to obtain data. The resist mask is formed to correspond to the thus obtained data. The resizing amount is suitably adjusted within about 0.5 to about 5 $\mu$m, or about 1 to about 3 $\mu$m, for example, taking the EB alignment margin into consideration. If the resizing amount in the original data exceeds the space width between the actual pattern lines, the pattern lines are overlapped to form a single rectangular pattern. The resist mask may suitably be formed by other known method than the above.

The etching is preferably performed by dry etching such as RIE. Conditions for the etching can suitably be selected depending on the thicknesses and kinds of the resist film, the thicknesses and kinds of the light-shielding film consisting the mask and the kind of dry etching technique. The patterning in this step does determine the configuration of the actual pattern and preferably performed with high accuracy.

In the step (c), the light-shielding film on the unoccupied region is removed while leaving the patterned light-shielding film on the actual pattern region. In this step, the light-shielding film on the unoccupied region must be removed completely. Further, if the previously patterned light-shielding film on the actual pattern region completely corresponds to the actual pattern to be obtained in the final stage, the entire light-shielding film on the actual pattern region must remain as it is. Alternatively, if the configuration of the light-shielding film is similar to the final actual pattern but requires further patterning, it may be partially removed in this step so as to completely correspond to the final actual pattern.

At this stage, it is preferred to leave the light-shielding film also on the periphery region and the regions between the cells.

The removal of the light-shielding film from the unoccupied region can be performed by a known method, e.g., photolithography and etching. For example, a positive or negative resist which is known in the art is applied on the light-shielding film and exposed to light for development using a known exposure system such as EB exposure system, laser exposure system or the like. Thus, a resist mask is formed and the light-shielding film is etched using the resist mask. The light exposure may be performed by full-wafer exposure or drawing exposure.

For fabricating the resist mask, for example, original data of the actual pattern is prepared and plus resizing is performed to the original data. Then the resized data is reversed to obtain dummy pattern data and plus resizing is performed to the dummy pattern data. The resist mask is formed to correspond to the thus resized dummy pattern data. The resizing amount is suitably adjusted within about 0.5 to about 5 $\mu$m, or about 1 to about 3 $\mu$m, for example, taking the EB alignment margin into consideration. Depending on the configuration of the actual pattern to be obtained, the resist mask may be formed corresponding to a data obtained by reversing the original data of the actual pattern. Further, the resist mask may suitably be formed by any other known method than the above ones.

The etching is preferably performed by dry etching such as RIE. This etching is not for the purpose of patterning the actual pattern, but for removing the so-called dummy pattern formed on the unoccupied region. Conditions for the etching can suitably be selected depending on the thicknesses and kinds of the resist film, the thicknesses and kinds of the light-shielding film consisting the mask and the kind of dry etching technique, as long as damage and step difference are not caused on the substrate surface. The patterning in this step does not affect the accuracy of the actual pattern and does not require high resolution and high accuracy for the exposure, as compared with the exposure described above. However, if the EB exposure system is used, it is preferable to form an organic conductive film on the resist in view of a problem of charge up. The organic conductive film may be Espacer 100 manufactured by Showa Denko, for example, in a thickness of about 10 to about 30 nm.

In the method for fabricating the mask according to the present invention, procedures that are commonly performed in the general mask fabrication, for example, pre-baking (e.g., on a hot plate in air at about 190° C. for about 15 minutes), post baking (e.g., on the hot plate in air at about 100° C. for about 15 minutes) and the like, may be carried out before/between/after the above steps.

Hereinafter, an embodiment of the method for fabricating the mask according to the present invention will be explained with reference to the figures.

Mask Fabrication

First, as shown in FIG. 1(a), on a mask substrate 1 quartz on which a chrome film 2 of about 50 to about 120 nm thick has been formed, a positive resist film 3 of about 150 to about 500 nm thick is formed entirely and a first light exposure is performed to the resist film 3. For example, the first light exposure is performed using an EB exposure system under the acceleration voltage of 10 kV and the light exposure amount of 6.0 to 8.0 $\mu C/cm^2$, so that actual resist patterns are formed in actual pattern regions R and dummy resist patterns are formed in unoccupied regions S that are regions other than the actual pattern regions to have a desired space from the actual resist patterns. Specifically, the first light exposure is carried out using data shown in FIG. 2(d) as mentioned later. Since the dummy resist patterns are formed in the unoccupied regions S through the first light exposure, variation in size of the resulting resist patterns due to the fogging phenomenon caused by the difference in density of pattern layout does not occur.

Figure 1B:
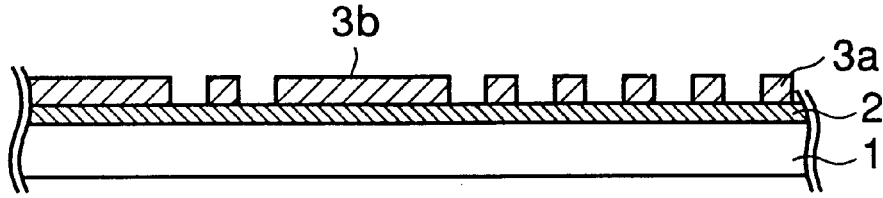

Then, as shown in FIG. 1(b), the resist film 3 is developed by a known method to form the actual resist patterns 3a corresponding to actual patterns on the actual pattern regions R and the dummy resist patterns 3b corresponding to dummy patterns on the unoccupied regions S. Thereafter, a thermal treatment (post baking) for degassing the resist patterns 3a and 3b is performed. The post baking is carried out on a hot plate in air at 100° C. for about 15 minutes.

Figure 1C:
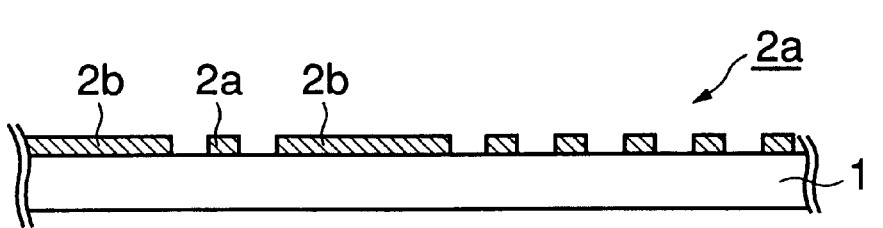

Then, using the actual and dummy resist patterns 3a and 3b as a mask, the chrome film 2 is patterned into the actual patterns 2a on the actual pattern regions R and the dummy patterns 2b on the unoccupied regions S by dry etching as shown in FIG. 1(c). The dry etching is carried out by RIE using $Cl_2$ and $O_2$ gases under power of 300 W and pressure of 25 Pa. At this stage, since the resist patterns 3b to form the dummy patterns 2b exist on the unoccupied regions S, the difference in area of the resist patterns surrounding regions for forming the actual patterns 2a is greatly reduced. Accordingly, the difference in etching rate of the chrome film is also reduced. As a result, the size variation of the chrome patterns can be inhibited. Simultaneously with the formation of the actual patterns 2a and the dummy patterns 2b, chrome patterns are formed on the periphery of the mask substrate 1 (not shown).

Figure 1D:
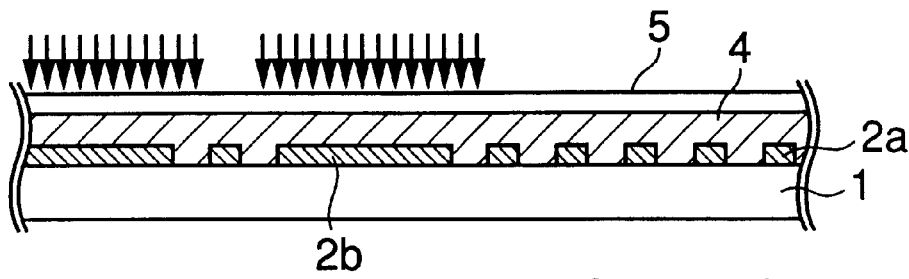

Next, as shown in FIG. 1(d), a resist film 4 of about 500 nm thick is formed on the resulting actual patterns 2a and the dummy patterns 2b. Then a film of about 20 nm thick is formed thereon as a conductive film 5. A second light exposure is then performed to the conductive film 5 and the resist film 4. The second light exposure is carried out using the EB exposure system under the acceleration voltage of 10 kV and the light exposure amount of about 2.8 to about 6.0 $\mu C/cm^2$ such that the resulting resist pattern opens above the dummy patterns 2b on the unoccupied regions S and covers the actual patterns 2a on the actual pattern regions R. Specifically, the second light exposure is performed using data shown in FIG. 2(e) as described later.

Figure 1E:
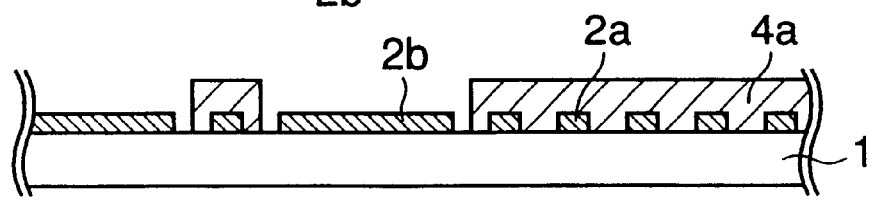

Then, as shown in FIG. 1(e), the conductive film 5 is selectively removed using a deionized water spray and the resist film 4 is developed to form resist patterns 4a which covers only the actual patterns 2a. Thereafter, a thermal treatment is performed for degassing the resist patterns 4a. The thermal treatment is carried out on the hot plate in air at 100° C. for about 15 minutes.

Figure 1F:
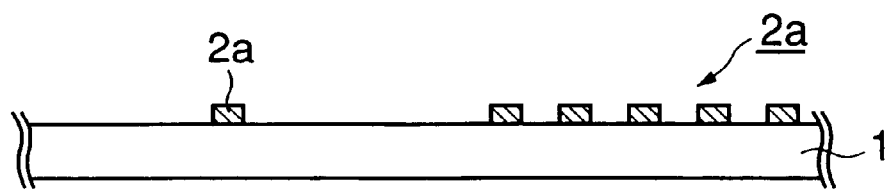

Using the resist patterns 4a as a mask, the dummy patterns 2b are completely etched away as shown in FIG. 1(f). This etching is performed not for patterning involved in the mask formation, but for the removal of the dummy patterns on the unoccupied regions S. Accordingly, the etching is carried out by RIE, for example, using $Cl_2$ of about 80 sccm and $O_2$ of about 20 sccm as the etching gas under power of about 80 W and pressure of about 6.8 Pa so as not to generate step difference on the mask substrate 1. Thus, the mask making is completed.

Data Processing of Dummy Pattern

Dummy pattern data is formed by conducting the following calculation using MEBES format data (EB exposure data for mask formation) manufactured by ETEC, USA.

Figure 2A:
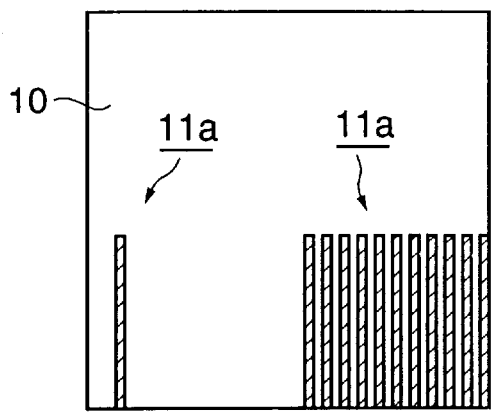
FIGS. 2(*a*) to 2(*f*) are views illustrating pattern data utilized for fabricating and removing a dummy pattern according to the method for fabricating the mask of the present invention.
Figure 2B:
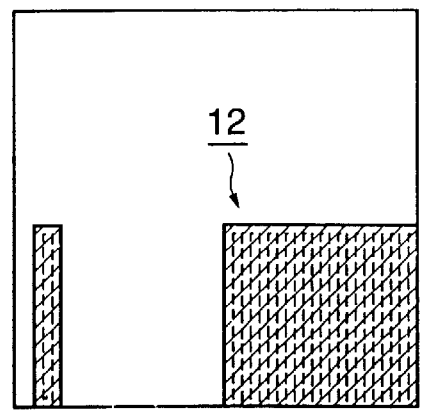

For fabricating a mask pattern including actual pattern lines 11a (width of a single patterned line: 0.7 $\mu$m; length: several $\mu$m to several hundreds $\mu$m; width of space between the pattern lines: 0.7 $\mu$m) on a unit cell 10 (e.g., several tens of mm×several tens of mm), first, original data of the actual pattern lines 11a as shown in FIG. 2(a) is obtained. Then as shown in FIG. 2(b), plus resizing is performed to the original data of the actual pattern lines 11a shown in FIG. 2(a). If the resizing amount exceeds the space width between the actual pattern lines 11a, the pattern lines contact or overlap with each other to form a single rectangular pattern 12. Next, the resulting resized data is reversed (FIG. 2(c)). Thus, data of dummy pattern 11b is obtained. Then, OR calculation is performed to the obtained data of the dummy pattern 11b and the original data of the actual pattern lines 11a (FIG. 2(d)). The resulting data is used for the first light exposure. For example, where a positive resist film is used for the first light exposure as described above, reverse exposure is performed using the data shown in FIG. 2(d) such that a resist pattern is formed on regions for forming the dummy pattern 11b and the actual pattern lines 11a.

Figure 2C:
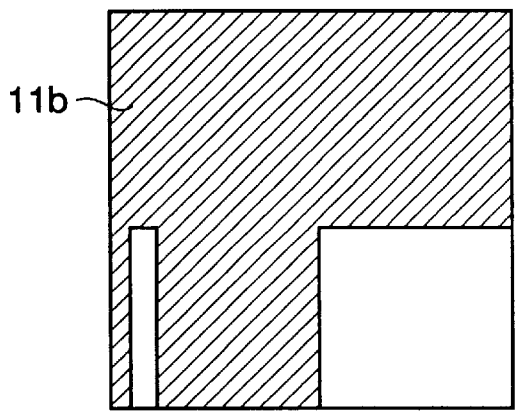
Figure 2D:
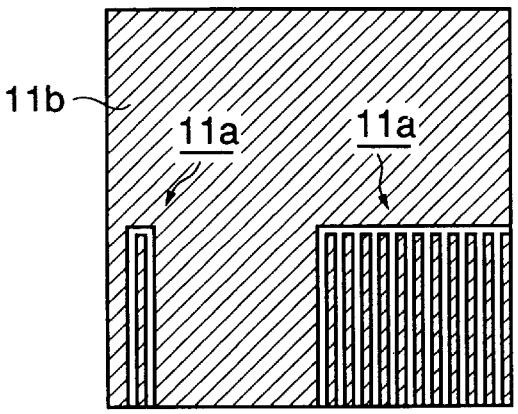
Figure 2E:
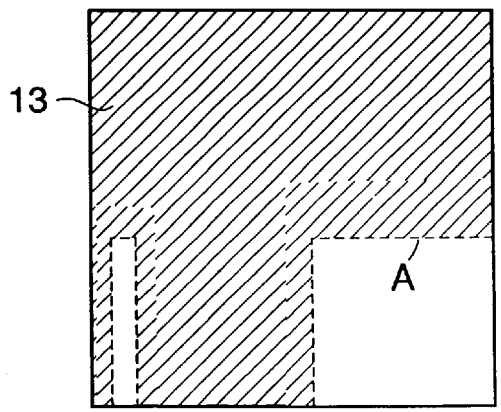
Figure 2F:
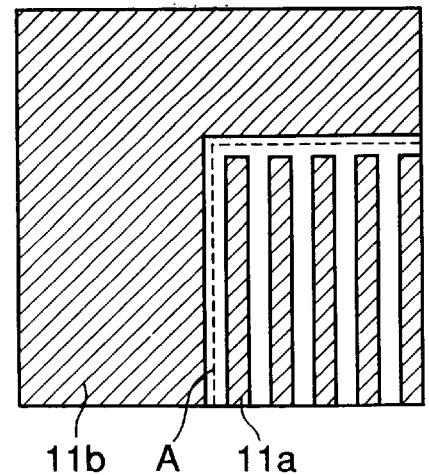

Further, as shown in FIG. 2(e), another plus resizing is performed to the data of the dummy pattern 11b shown in FIG. 2(c). The resulting data including a pattern 13 is used in the second light exposure for two-dimensionally separating the actual patterns 2a and the dummy patterns 2b patterned in the step shown in FIG. 1(c). Where the second light exposure is performed, it is necessary that the edge A of the pattern 13 is positioned between the actual pattern lines 11a and the dummy pattern 11b in FIG. 2(d). The space between the actual pattern lines 11a and the dummy pattern 11b is determined by the resized width the resizing in the step shown in FIG. 2(b). In the second light exposure, about half of the space between the actual pattern lines 11a and the dummy pattern 11b will be an alignment margin, which needs to be considered for the resizing. Specifically, the space between the actual pattern lines 11a and the dummy pattern 11b can be ensured by setting the space greater than the alignment margin (e.g., ±0.5 $\mu$m).

Evaluation of Size Variation of Mask Patterns on a Surface

Figure 3A:
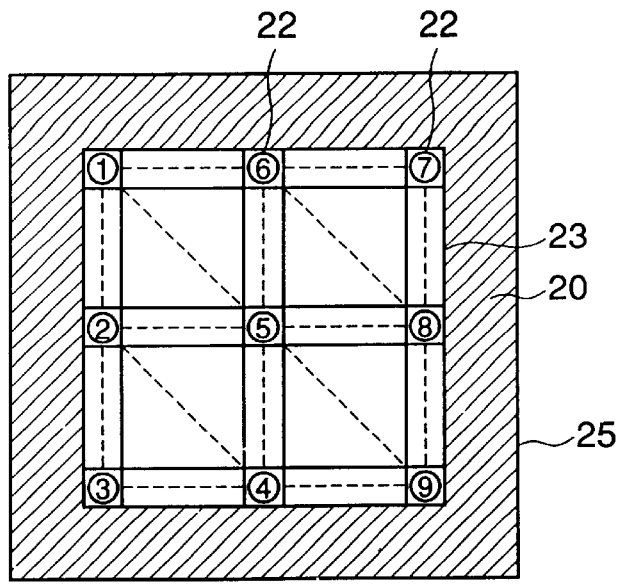
FIGS. 3(*a*) and 3(*b*) are plan views of a substrate and FIG. 3(*c*) is a graph, both explaining evaluation of a mask obtained by the method for fabricating the mask of the present invention.
Figure 3B:
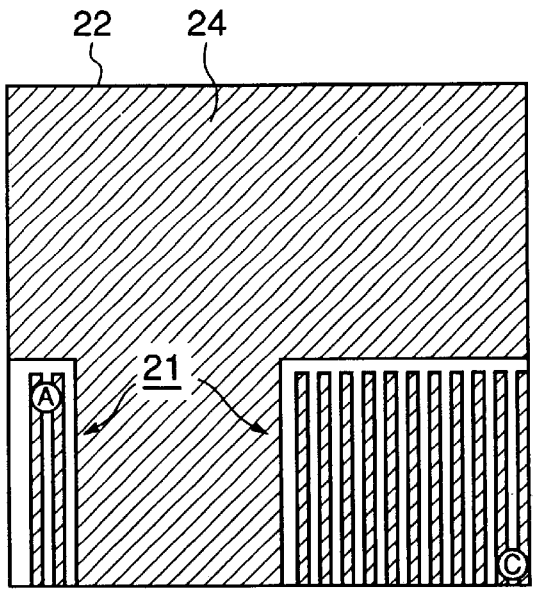

According to the same method as the above, a resist film is formed on a periphery 20 around a field region 23 of a mask substrate 25 and plural unit cells 22 are formed on the field region 23 to form a mask as shown in FIG. 3(a). Then the space width between the mask pattern lines in each cell on the mask substrate 25 is measured. The mask is obtained by forming actual pattern lines 21 and dummy pattern 24 having the configuration as shown in FIG. 3(b) on the unit cell 22 and then removing the dummy pattern 24. A single actual pattern line has the width of 0.7 $\mu$m and the length of several $\mu$m to several hundreds $\mu$m. The width of space between the actual pattern lines 21 is 0.7 µm and the distance between the actual pattern lines 21 and the dummy pattern 24 is 2.0 µm.

Figure 4A:
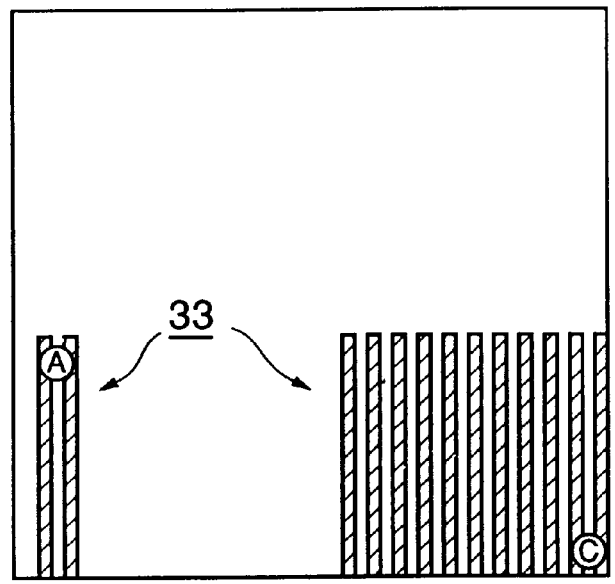
FIGS. 4(*a*) is a plan view of a substrate and FIG. 4(*b*) is a graph, both explaining evaluation of a mask obtained by a comparative method to the method for fabricating the mask of the present invention.
Figure 4B:
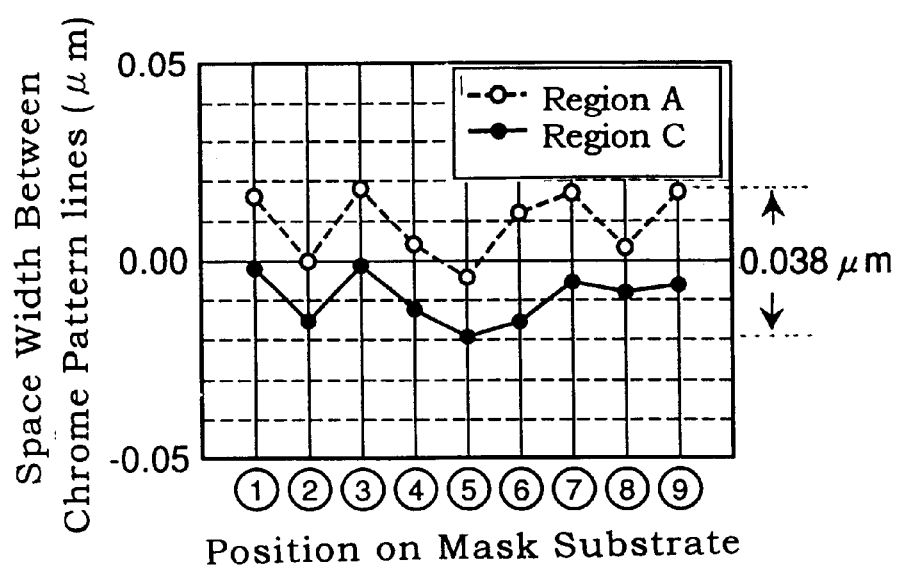
Figure 5:
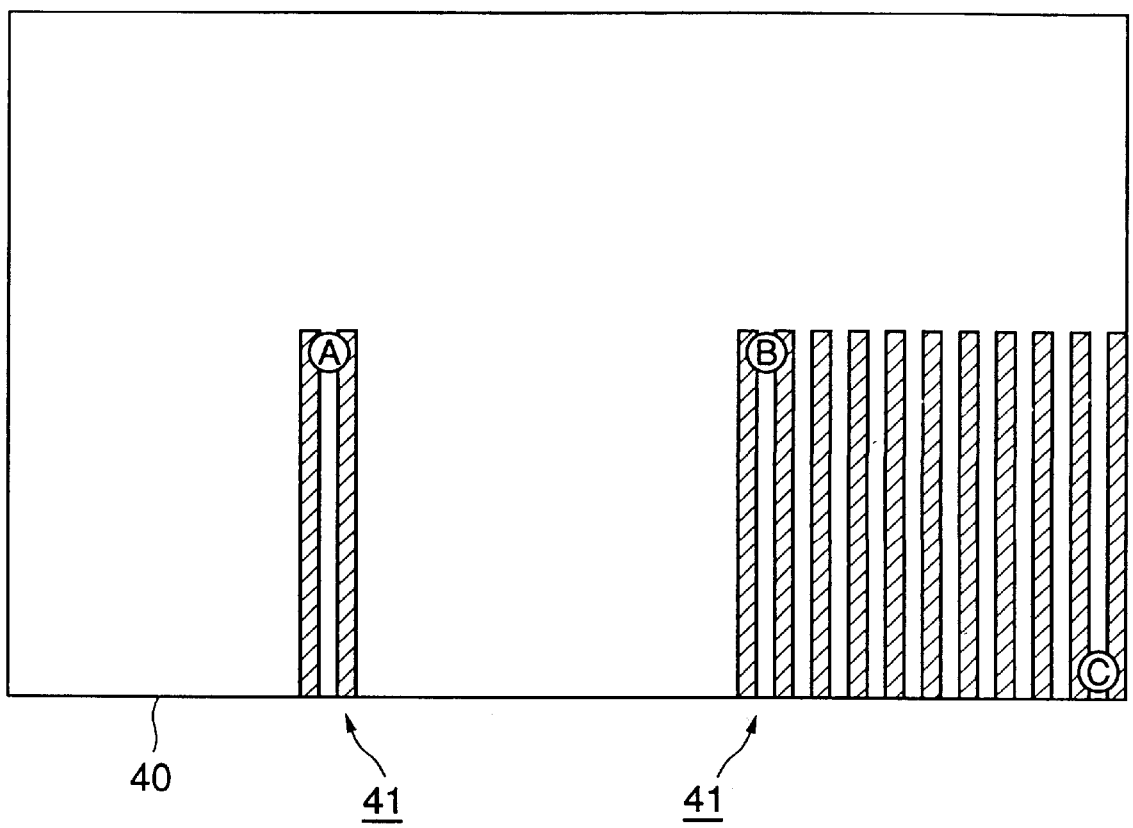
FIG. 5 is a plan view for illustrating a drawback of a conventional method for fabricating a mask.
Figure 6:
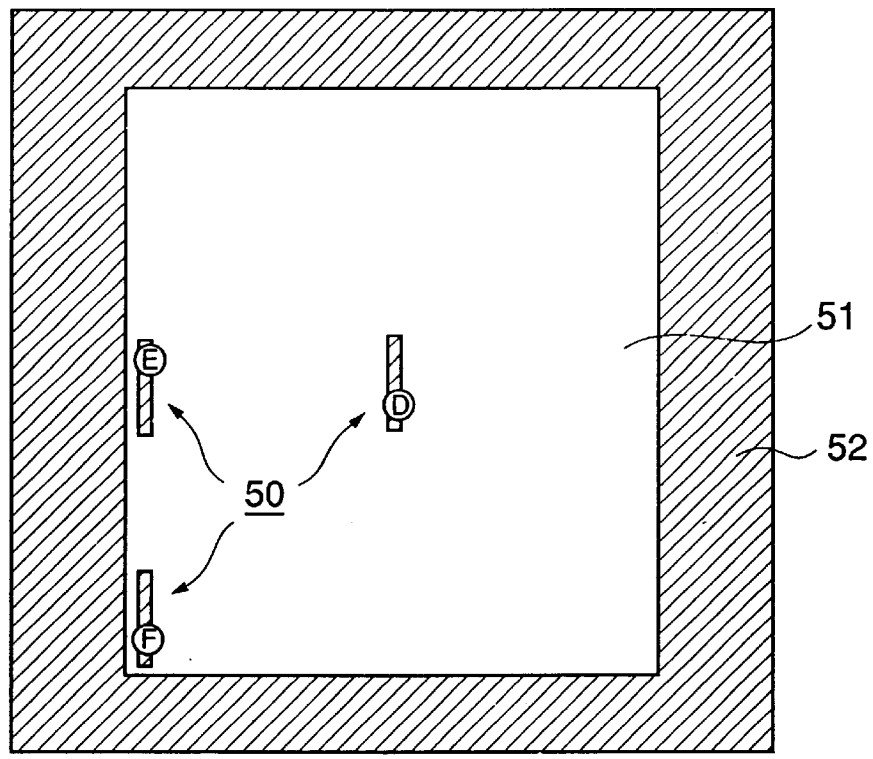
FIG. 6 is a plan view for illustrating a drawback of another conventional method for fabricating a mask.
Figure 7:
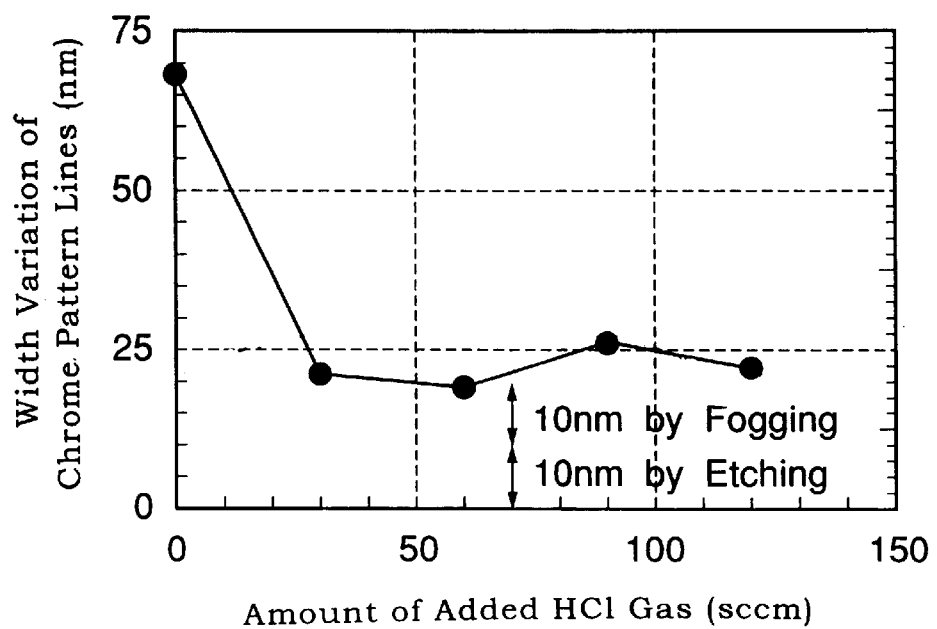
FIG. 7 is a graph illustrating a relationship of variation in width of chrome pattern lines formed by conventional dry etching and the amount of added HCl gas.

For comparison, a comparative mask is formed under the same conditions (EB lithography, chrome etching) except that actual pattern lines 33 as shown in FIG. 4(*a*) are formed directly on the mask substrate. Then the space width between the mask pattern lines in each cell on the mask substrate is measured.

Figure 3C:
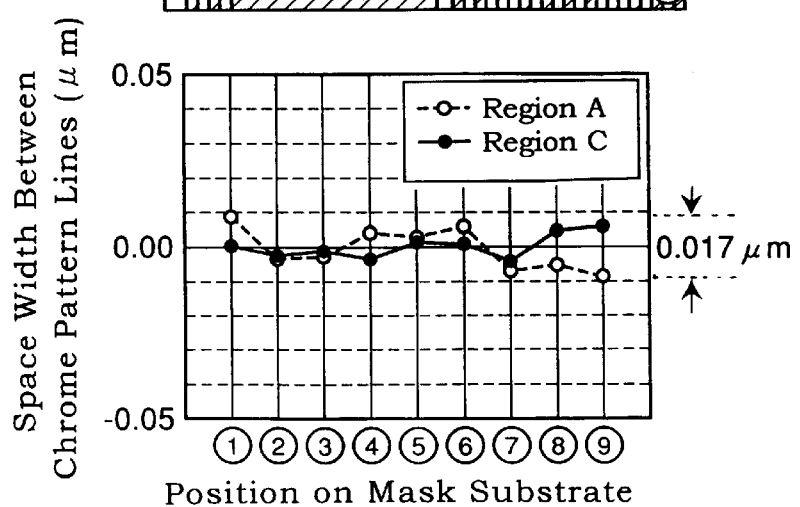

The results are shown in FIGS. 3(*c*) and 4(*b*), respectively.

Referring to FIGS. 3(*c*) and 4(*b*), the difference in space width in the comparative mask was 0.018 µm, whereas −0.001 µm in the mask formed according to the present invention. The variation in space width on the mask substrate surface was reduced from 0.038 µm to 0.017 µm.

Thus, according to the present invention, by providing the dummy pattern on the unoccupied region other than the region for the LSI actual pattern, the mask can be formed without difference in density of the pattern layout. Consequently, in a photolithography step (formation of the resist pattern), the size difference of the resist pattern lines due to the fogging can be reduced.

Further, in the step of dry etching of the chrome film, the difference in etching rate due to the resist area (difference in density of the pattern layout, difference between the periphery and the center of the chip) can be reduced.

Accordingly, in the two steps in the mask fabrication, the size variation of the patterned lines can be reduced and as a result, a highly precise mask, which can be used as a proximity exposure effect correction mask, can be formed.

According to the present invention, the light-shielding film on the actual pattern region is patterned in a desired configuration and the so-called dummy pattern is formed on the unoccupied region. Then the dummy pattern is removed while leaving the patterned light-shielding film on the actual pattern region. Thus, the size variation in the obtained pattern lines due to the difference in density of the pattern layout can be greatly reduced and a mask of high accuracy of any pattern configuration can be formed. Thus, the yield of the mask fabrication increases and high yield can be ensured in the manufacture of LSI chips.

Particularly, the accuracy in the pattern size can be more ensured because the light-shielding film is patterned and removed by dry etching, the light-shielding film is also formed on the periphery region surrounding the actual pattern region and the unoccupied region on the substrate and the light-shielding film is a chrome film and/or the substrate is a quartz substrate. Therefore, higher yield can be realized in the mask formation.

What is claimed is:

1. A method for fabricating a mask having an opaque pattern, the method comprising:

(a) forming a light-shielding opaque film on an entire surface of a substrate including an actual pattern region to include a patterned portion of the light-shielding opaque film in the final mask product, and an unoccupied region other than the actual pattern region which is to not include the light-shielding opaque film in the final mask product;

(b) forming a first resist on the substrate over at least part of the light-shielding opaque film and etching at least part of the opaque film using the first resist in a first etching step in patterning the light-shielding opaque film on the actual pattern region while leaving the light-shielding opaque film on the unoccupied region, the patterned light-shielding opaque film on the actual pattern region including a plurality of areas where the light-shielding opaque film remains spaced apart by areas where the light-shielding opaque film has been removed during the patterning; and (c) after said first etching step and patterning of (b), and after removing the first resist from the substrate, forming a second resist having a different configuration than the first resist on the substrate over at least part of the remaining light-shielding opaque film and etching away the remaining light-shielding opaque film from the unoccupied region using the second resist in a second etching step in thereby removing the light-shielding opaque film from the unoccupied region while leaving the patterned light-shielding opaque film in the actual pattern region, so that the light-shielding opaque film does not remain in the unoccupied region and no pattern remains in the unoccupied region, and an opaque pattern of the final mask product to be used for subsequent patterning is defined by the patterned light-shielding opaque film in the actual pattern region.

2. A method according to claim 1, wherein the patterning and the removal of the light-shielding film in the steps (b) and (c) are performed by dry etching.

3. A method according to claim 1, wherein the patterning in the step (b) is carried out using a mask pattern corresponding to data obtained by performing plus resizing to original data of the actual pattern, reversing the resized data to form dummy pattern data and performing OR calculation to the dummy pattern data and the original data of the actual pattern.

4. A method according to claim 1, wherein the removal of the light-shielding film in the step (c) is carried out using a mask pattern corresponding to data obtained by performing plus resizing to original data of the actual pattern, reversing the resized data to form dummy pattern data and performing plus resizing to the dummy pattern data.

5. A method according to claim 1, wherein the light-shielding film is formed on a periphery region surrounding the actual pattern region and the unoccupied region on the substrate.

6. A method according to claim 1, wherein the light-shielding film is a chrome film, a half tone film or a layered film thereof.

7. A method according to claim 1, wherein the substrate is a quartz substrate.

8. The method of claim 1, wherein the first resist is a positive resist.

9. The method of claim 1, wherein the second resist is a positive resist.

10. A method of making a mask having an opaque pattern, the method comprising:

forming a light-shielding opaque film on a surface of a substrate including an actual pattern region and an unoccupied region;

forming a first resist over at least part of the light-shielding opaque film;

etching at least part of the opaque film using the first resist in a first etching step in using the first resist in patterning the light-shielding film on the actual pattern region and causing portion(s) of the light-shielding opaque film to remain on the unoccupied region as dummy pattern portion(s);

after said first etching step and after removing the first resist from the substrate, forming a second resist, different than the first resist, over at least part of the light-shielding opaque film remaining after the patterning; and using the second resist in removing the dummy pattern portion(s) of the light-shielding opaque film from the unoccupied region while leaving the patterned light-shielding opaque film on the actual pattern region of the substrate.

11. The method of claim 10, wherein dry etching is used in patterning the light-shielding film on the actual pattern region and causing the portion(s) of the light-shielding opaque film to remain on the unoccupied region as dummy pattern portion(s).

12. The method of claim 10, further comprising forming a conductive layer over the second resist, prior to patterning of the second resist.

* * * * *